United States Patent [19]

Reneau et al.

[11] Patent Number: 4,513,320

[45] Date of Patent: Apr. 23, 1985

[54] NON-LINEAR PEAKING SYSTEM

[75] Inventors: Daniel L. Reneau, Elmhurst; George J. Tzakis, Glenview; Christopher M. Engel, Arlington Heights, all of Ill.

[73] Assignee: Zenith Electronics Corporation, Glenview, Ill.

[21] Appl. No.: 472,785

[22] Filed: Mar. 7, 1983

[51] Int. Cl.³ .............................................. H04N 5/14
[52] U.S. Cl. .................................... 358/166; 358/37; 330/258
[58] Field of Search ............................ 358/39, 37, 166; 330/258

[56] References Cited

U.S. PATENT DOCUMENTS

| | | | |
|---|---|---|---|
| 3,353,111 | 11/1967 | Van Wilson | 330/258 X |
| 4,263,616 | 4/1981 | Lee | 358/166 |
| 4,296,435 | 10/1981 | d'Hautecourt et al. | 358/166 |

Primary Examiner—John C. Martin
Assistant Examiner—Michael Dunnam

[57] ABSTRACT

A luminance peaking circuit includes a common and differential mode amplifier comprising a first differentially coupled pair of transistors coupled to a current source and functioning in a differential mode and a second differentially coupled pair of transistors functioning in a common mode. The bases of the second pair of transistors are connected together and to the base of one of the first pair of transistors. The inputs to the amplifier comprise a common mode signal and a differential mode signal and the outputs are matrixed to produce common mode signal components with opposite polarity differential mode components. The amplifier is characterized by a differential mode gain that is independent of common mode signal level and a common mode gain that is independent of differential signal level.

8 Claims, 2 Drawing Figures

NON-LINEAR PEAKING SYSTEM

CROSS REFERENCE TO RELATED PATENTS

This application incorporates the circuits and inventions described in U.S. Pat. No. 4,263,616, entitled Signal Peaking Method and Apparatus, issued Apr. 21, 1981, in the name of R. Lee and U.S. Pat. No. 4,296,435, entitled Luminance Signal Processing Circuit, issued Oct. 20, 1981, in the names of A. d'Hautecourt, W. Bretl and R. Lee, both patents being assigned to Zenith Radio Corporation and both incorporated by reference herein.

BACKGROUND OF THE INVENTION AND PRIOR ART

This invention relates generally to luminance signal peaking circuits and particularly to a common and differential mode amplifier useful in such circuits. In television, a so-called luminance signal is one that is representative of black and white content of an image. It is a baseband signal, developed in the output of the video detector and used to modulate the receiver cathode ray tube to control the brightness and contrast of the reproduced image. In color receivers, the luminance signal is very similar to the complete video signal in monochrome receivers. The luminance channel in a color receiver includes one or more stages of signal amplification and also incorporates a time delay to compensate for the slower processing experienced by the color or chrominance signal in the narrower bandwidth chrominance channel.

While the luminance channel is, comparatively speaking, wideband, analog signals that carry luminance information are very often degraded because of bandwidth limitations. A major type of degradation results in the signal "rise and fall" times being undesirably long with the result that the reproduced picture lacks "crispness". It is well known and conventional to "peak" the luminance signal by adding "pre-shoot" and "overshoot" to effectively speed up its rise and fall times to provide a more pleasing television image.

Many signal peaking methods have been used in the prior art. In general tradeoffs must be made between sharply peaked signals and noise. In U.S. Pat. No. 4,263,616 mentioned above, the peaking methods of "straight coring" and "nonlinear amplification" are discussed. Both methods derive a peaking signal by subtracting the second derivative of a low pass video signal from the video signal itself. The improved method of signal peaking taught in the patent involves developing an additional adjustable control signal having magnitude variations which are related to, and occur in time correlation with, amplitude transitions in both the video signal and the peaking signal. The control signal modulates the peaking signal such that it experiences a first gain at a threshold level and a second gain below that threshold level. The result is television pictures having sharply peaked high level brightness transitions which are still natural looking without excessive noise. This desirable result is due to the presence of a small amount of low level peaking components and noise in the peaking signal.

U.S. Pat. No. 4,296,435, discloses a novel arrangement of the elements in the signal peaking circuitry of U.S. Pat. No. 4,263,616. In particular the series of cascaded signal processing stages, which had been operated from their own sources of DC potential, are replaced by a circuit arrangement which, not only conserves operating power, but includes dynamic noise processed peaking that accentuates luminance transitions. Also, the circuitry does not accentuate noise signal spikes occurring during flat field portions of the luminance signal. Further, the system minimizes "blooming" due to excessive white-going peaking signals and enables the amount of peaking and the brightness or contrast of the reproduced image to be independently controllable by the viewer.

This invention embraces the teachings and circuitry of both of the above patents and provides an improved common and differential mode amplifier for developing the two peaking signals for use by the peaking precessors therein. In particular, U.S. Pat. No. 4,296,435 includes a well-known common and differential mode amplifier for developing the opposite polarity differential mode signals and the like polarity common mode signals. The amplifier is supplied with a common mode signal, comprising the low pass luminance signal, and the current mode signals developed in its two outputs thus include in-phase low pass luminance components. The differential mode signal supplied to the amplifier comprises the second derivative of the low pass luminance signal and the current mode signals developed in the outputs also include out-of-phase second derivative components. The signals in the two outputs are matrixed for further processing with the differential mode gain of the peaking processor being controllable by the viewer.

The prior art differential type amplifier used has a common mode gain and a differential mode gain associated therewith. While the system of the patents work quite well, it would be most desirable to keep the common mode gain and the differential mode gain of the amplifier independent of each other to avoid changes in peaking as a function of signal level changes. Specifically, as the common mode signal level changed, the amount of peaking would change, which was not always desirable.

OBJECTS OF THE INVENTION

A principle object of this invention is to provide an improved luminance signal processing circuit.

Another object of this invention is to provide a nonlinear peaking system for a luminance channel having a common and differential mode amplifier with independently controllable gain characteristics.

SUMMARY OF THE INVENTION

In accordance with the invention a television luminance channel signal peaking circuit includes a peaking signal, comprising the second derivative of a low pass luminance signal and the low frequency portion of the luminance signal for signal enhancement, amplifier means for deriving signals representing the low frequency luminance signal and opposite polarities of the second derivative of the low frequency luminance signal, having first and second differential amplifiers arranged such that the common mode gain of the amplifier means is substantially unaffected by the differential mode signal level and the differential mode gain of the amplifier means is substantially unaffected by the common mode signal level.

BRIEF DESCRIPTION OF THE DRAWINGS

Other objects and advantages of the invention will become apparent by reading the following description thereof in conjunction with the drawings in which.

DESCRIPTION OF THE PREFERRED EMBODIMENT

Figure 1:
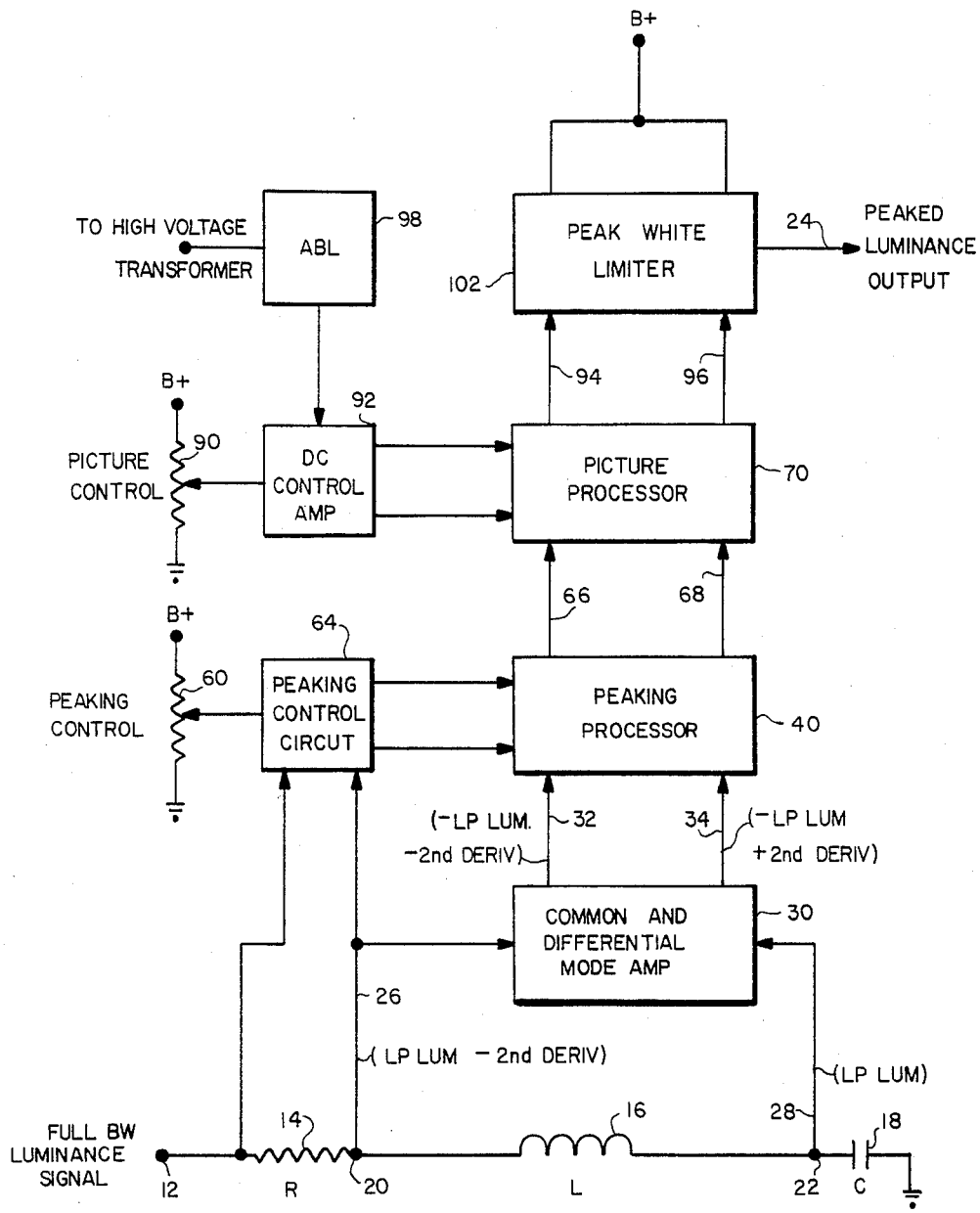
FIG. 1 represents a block diagram of the prior art peaking circuit of U.S. Pat. No. 4,296,435.

Referring to FIG. 1, a luminance signal processing circuit corresponding to U.S. Pat. No. 4,296,435 is shown. An input at terminal 12 receives a full bandwidth luminance signal from the video detector of a conventional television receiver (not shown). Terminal 12 supplies a series-connected RLC circuit which consists of a resistor 14, an inductor 16 and a capacitor 18, one side of which is connected to ground. The RLC circuit functions to separate the full bandwidth luminance signal at input terminal 12 into various components. The voltage to ground at node 20, for example, which is the junction between resistor 14 and inductor 16, includes the low pass luminance signal and a second derivative component of the low pass luminance signal. The node 22 between inductor 16 and capacitor 18 has a voltage to ground that includes the low pass luminance signal only. Thus a differential voltage is developed across inductor 16 which represents the second derivative of the low pass luminance signal. The differential voltage developed across resistor 14 represents the first derivative of the low pass luminance signal, but it is not involved with this invention.

The signal voltages developed at nodes 20 and 22 are coupled over a pair of leads 26 and 28 to a common and differential mode amplifier 30 which develops a pair of current mode signals in its output conductors 32 and 34, the polarities of which are represented by the arrows. Since the common signal applied to amplifier 30 comprises the low pass luminance signal, the current mode signals developed in conductors 32 and 34 include in-phase low pass luminance components indicated by the legends −LP Lum. The differential signal applied to amplifier 30 comprises the second derivative signal and the current mode signals developed in the output conductors also include out-of-phase second derivative components indicated by the legends −LP Lum−2nd Deriv and −LP Lum+2nd Deriv.

The current mode signals developed in conductors 32 and 34 are conveyed to a peaking processor 40 which is controlled by a viewer operable peaking control potentiometer 60 and a peaking control circuit 64. As is fully explained in the above mentioned patent, the differential mode gain of the peaking processor is controllable responsive to the peaking control circuit to develop corresponding current mode peaking signals in a pair of output conductors 66 and 68, respectively, having amplitudes adjusted in accordance with the setting of potentiometer 60. The peaking processor is also operated in a dynamic mode wherein its differential gain is increased as a function of the setting of the user peaking control 60 in response to transitions in the luminance signal and is decreased when there are no luminance transitions.

The current mode signals in conductors 66 and 68 are coupled to picture processor 70 which is also operable in both a differential and a common mode. The gain of processor 70 is determined by a viewer operable picture control potentiometer 90 and a DC control amplifier 92 for developing amplitudeadjusted current mode signals in output leads 94 and 96, respectively, for controlling the contrast of the reproduced television image. An automatic beam limiter 98 is coupled to DC control amplifier 92 for reducing the gain in the picture processor in response to excessive picture tube beam currents. A peak white limiter 102 is connected to a source of B+ potential and converts the current mode signals developed in conductors 94 and 96 to corresponding voltage signals on an output conductor 24, which is the output of the luminance processing circuit. The output signal thus includes low pass luminance components and 180° out-of-phase second derivative peaking components. The amplitude of the entire luminance signal is controllable by the picture processing circuitry for adjusting the resultant picture contrast, while the dynamic peaking signal component is independently controllable by the peaking processor for setting desired peaking level.

Figure 2:
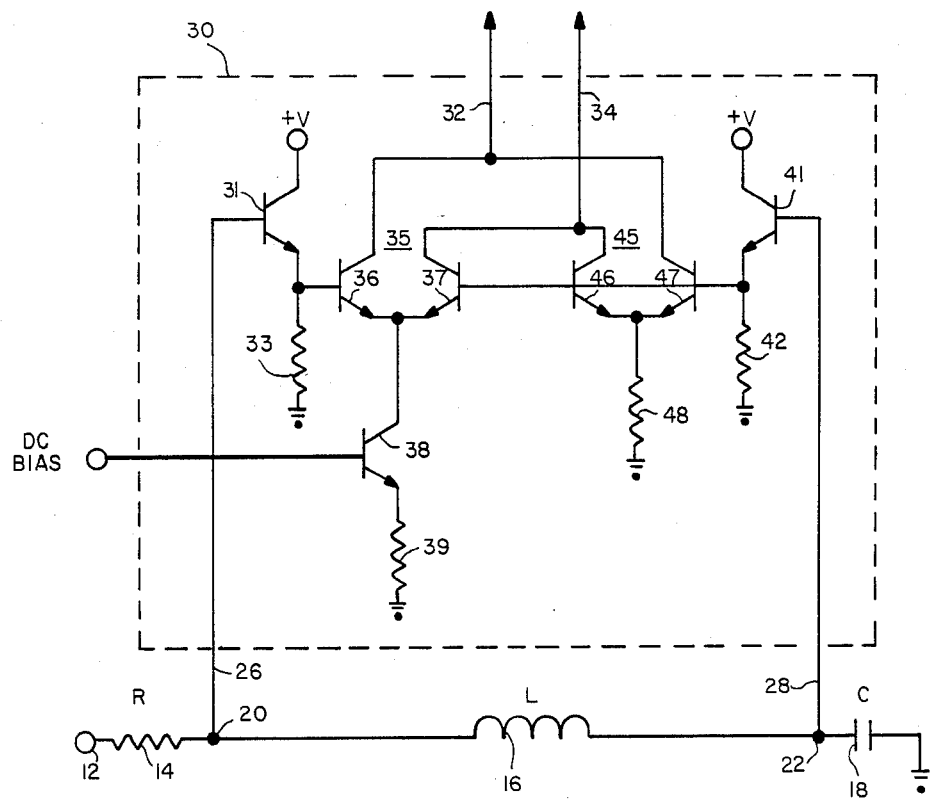
FIG. 2 represents a detailed schematic diagram of the common and differential mode amplifier means of the invention.

The novel differential and common mode amplifier of the invention is shown in FIG. 2. The amplifier is indicated by dashed line 30 and includes a pair of emitter follower transistors 31 and 41 having their inputs connected to nodes 20 and 22 respectively, and their output signals developed across a pair of resistors 33 and 42, respectively. A pair of differential amplifiers 35 and 45 each have an input transistor (36 and 47, respectively) supplied from a respective one of emitter follower resistors 33 and 42. Thus the inputs to transistors 36 and 47 are the low pass luminance signal (common mode signal) and the second derivative of the low pass luminance signal (differential mode signal). Amplifier 35 includes a second transistor 37 differentially coupled to transistor 36. The emitters of these transistors are connected to a current source transistor 38. The emitter of transistor 38 is connected to ground through a resistor 39, and its base is coupled to a source of DC bias potential. As is well-known in the art, transistor 38 functions, in conjunction with the resistance of resistor 39, to effectively maintain a constant current flow therein and thus rejects any common mode signals applied to transistors 36 and 37. Amplifier 45 also includes a second transistor 46 differentially coupled to transistor 47, with the emitters of both being connected to a resistor 48, which in turn, is connected to ground. The bases of transistors 46 and 47 are connected together. The collectors of transistor 36 and transistor 47 are connected to output conductor 32 and the collectors of transistors 37 and 46 are connected to ouptut conductor 34. The bases of transistors 37 and 46 are also connected together.

Since the bases of transistors 46 and 47 are connected together, amplifier 45 operates as a single stage with two outputs. Resistor 48 is relatively small and amplifier 45 thus functions as a common mode signal amplifier for amplifying the common mode portion of the applied signals.

As mentioned above, the presence of current source transistor 38 causes amplifier 35 to reject common mode signals and thus it responds essentially only to the differential signal, namely the second derivative component. It will be further appreciated by those skilled in the art that the common mode gain of amplifier 30 is unaffected by the signal level of the second derivative component and the differential mode gain is substantially unaffected by the signal level of the low pass luminance component. Consequently the limitation in the above described circuit has been overcome by the circuit of the invention.

What has been described is a novel common and differential mode amplifier arrangement in which the differential mode gain of the amplifier is independent of common mode signal and the common mode gain of the amplifier is independent of differential mode signal. It will be recognized that numerous changes and modifications in the invention as described will be apparent to those skilled in the art without departing from its true spirit and scope. The invention is to be limited only as defined in the claims.

We claim:

1. A television luminance signal peaking circuit of the type wherein a peaking signal comprising the second derivative of the low pass luminance signal in conjunction with the low frequency portion of the luminance signal is used for signal enhancement and wherein amplifier means are provided for deriving signals representing the low pass luminance signal and opposite polarities of the second derivative of the low pass luminance signal, the improvement comprising:

first and second differential amplifiers in said amplifier means connected such that the common mode gain of said amplifier means is substantially unaffected by the differential mode signal level and the differential mode gain of said amplifier means is substantially unaffected by the common mode signal level.

2. The circuit of claim 1, wherein one of said differential amplifiers includes a current source for rendering it insensitive to common mode signal level changes.

3. The circuit of claim 2 wherein each of said differential amplifiers includes a differentially coupled pair of transistors having common outputs, the differential mode signal being coupled to the inputs of respective ones of the transistors in said differentially coupled pairs and the low pass luminance signal and opposite polarities of said second differential of said low pass luminance signal appearing in said common outputs of said transistors.

4. The circuit of claim 3 wherein the base electrodes of three of said transistors in said differentially coupled pairs of transistors are commonly connected.

5. A luminance signal peaking arrangement for a television receiver comprising;

a signal source including a low pass luminance signal and the second derivative of the low pass luminance signal;

differential amplifier means having inputs coupled to said signal source for deriving outputs including said low pass luminance signal and opposite polarities of said second derivative of said low pass luminance signal; and two sets of differentially coupled pairs of transistors for processing said low pass luminance signal and said second derivative of said low pass luminance signal without interaction.

6. The peaking arrangement of claim 5 wherein one of said pairs of differentially coupled transistors is supplied with said second derivative signal and the other of said pairs of differentially coupled transistors is supplied with said low pass luminance signal.

7. The peaking arrangement of claim 6 wherein said one pair of differentially coupled transistors includes a current source for rendering it insensitive to common mode signals.

8. The peaking arrangement of claim 7 wherein said current source comprises a high impedance transistor coupled to the commonly connected emitters of the transistors in said one pair.

* * * * *